(12) United States Patent
Namie

(10) Patent No.: US 10,510,930 B2
(45) Date of Patent: Dec. 17, 2019

(54) LIGHT EMITTING DEVICE

(71) Applicant: NICHIA CORPORATION, Anan-shi, Tokushima (JP)

(72) Inventor: Takashi Namie, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/854,525

(22) Filed: Dec. 26, 2017

(65) Prior Publication Data

US 2018/0182928 A1 Jun. 28, 2018

(30) Foreign Application Priority Data

Dec. 27, 2016 (JP) .................................. 2016-254214

(51) Int. Cl.
*H01S 5/022* (2006.01)
*H01L 33/48* (2010.01)
(Continued)

(52) U.S. Cl.
CPC ........ *H01L 33/483* (2013.01); *H01L 25/0753* (2013.01); *H01L 33/58* (2013.01); *H01L 33/62* (2013.01); *H01S 5/02212* (2013.01); *H01S 5/02276* (2013.01); *H01S 5/02288* (2013.01); *H01S 5/02292* (2013.01);
(Continued)

(58) Field of Classification Search
CPC ............. H01S 5/02212; H01S 5/02276; H01S 5/02288; H01S 5/0425; H01S 5/4018; H01S 5/02216; H01S 5/02296; H01S 5/4025; H01S 5/005; H01L 33/483; H01L 33/62; H01L 33/58; H01L 25/0753; H01L 2224/48091; H01L 33/60
See application file for complete search history.

(56) References Cited

U.S. PATENT DOCUMENTS

2010/0142181 A1* 6/2010 Schmidt ................ C04B 35/593
362/84
2010/0164346 A1* 7/2010 Li .......................... F21S 10/02
313/46
(Continued)

FOREIGN PATENT DOCUMENTS

JP 2003-100920 A 4/2003
JP 2003-101042 A 4/2003
(Continued)

*Primary Examiner* — Yuanda Zhang
(74) *Attorney, Agent, or Firm* — Foley & Lardner LLP

(57) ABSTRACT

A light-emitting device includes: a package made of a metal material and defining a recess, the package comprising a side wall defining a side of the recess; a plurality of light-emitting elements disposed in the recess; and a cover member disposed so as to close an opening of the recess, the cover member including: a light-transmitting member having a primary surface, a ceramic member having a loop-shape and having a first surface and a second surface opposite the first surface, the first surface bonded to the primary surface of the light-transmitting member via a bonding material, and a metal member having a loop-shape and including: a first portion bonded to the second surface of the ceramic member, and a second portion located outward of the first portion in a plan view and joined to an upper surface of the side wall of the package.

12 Claims, 7 Drawing Sheets

(51) Int. Cl.
  *H01L 25/075*  (2006.01)
  *H01L 33/58*   (2010.01)
  *H01L 33/62*   (2010.01)
  *H01S 5/042*   (2006.01)
  *H01S 5/40*        (2006.01)
  *H01S 5/00*        (2006.01)
  *H01L 33/60*       (2010.01)

(52) U.S. Cl.
  CPC ........ *H01S 5/02296* (2013.01); *H01S 5/0425* (2013.01); *H01L 33/60* (2013.01); *H01L 2224/48091* (2013.01); *H01S 5/005* (2013.01); *H01S 5/02216* (2013.01); *H01S 5/4018* (2013.01); *H01S 5/4025* (2013.01)

(56) References Cited

U.S. PATENT DOCUMENTS

| | | | |
|---|---|---|---|
| 2011/0186880 A1* | 8/2011 | Kohler | F21K 9/00 |
| | | | 257/91 |
| 2012/0133268 A1* | 5/2012 | Hwu | F21V 31/00 |
| | | | 313/489 |
| 2012/0186077 A1* | 7/2012 | Hwu | H01L 25/0753 |
| | | | 29/825 |
| 2017/0063032 A1* | 3/2017 | Morizumi | H01S 5/02208 |

FOREIGN PATENT DOCUMENTS

| | | |
|---|---|---|
| JP | 2006-066645 A | 3/2006 |
| JP | 2015-195330 A | 11/2015 |

\* cited by examiner

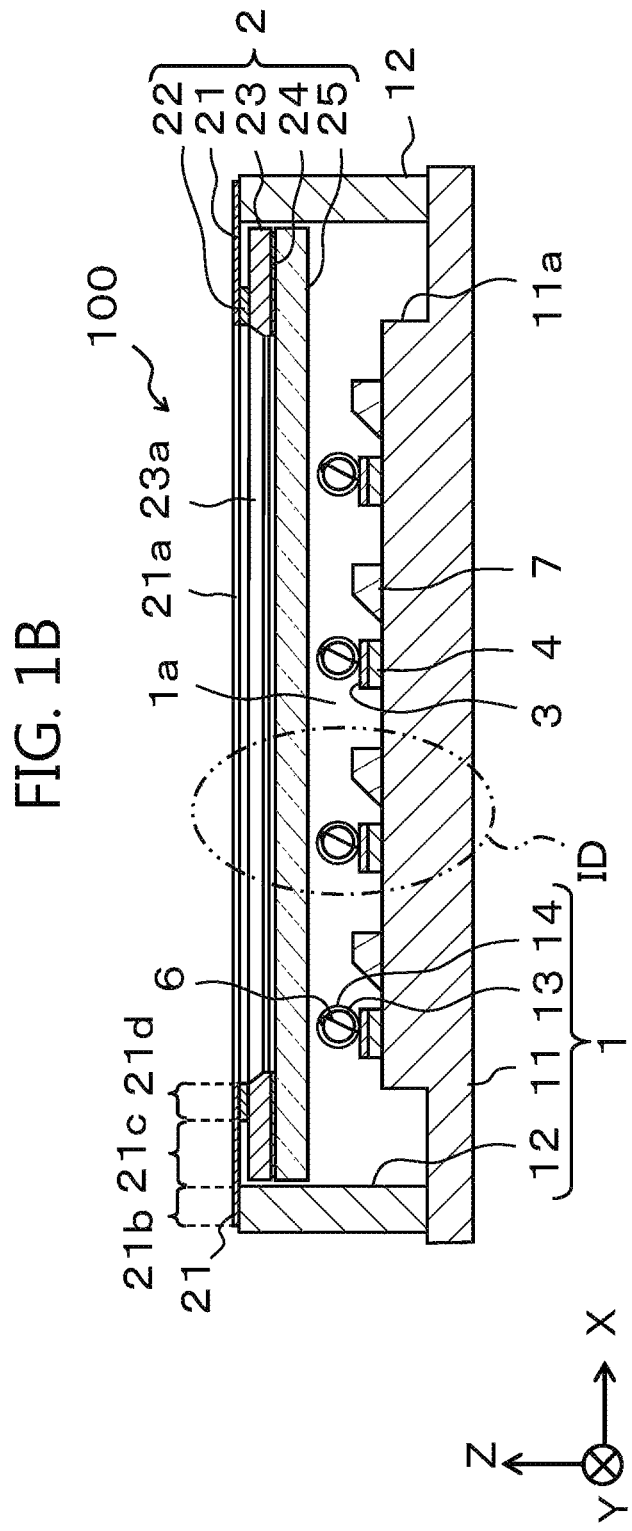

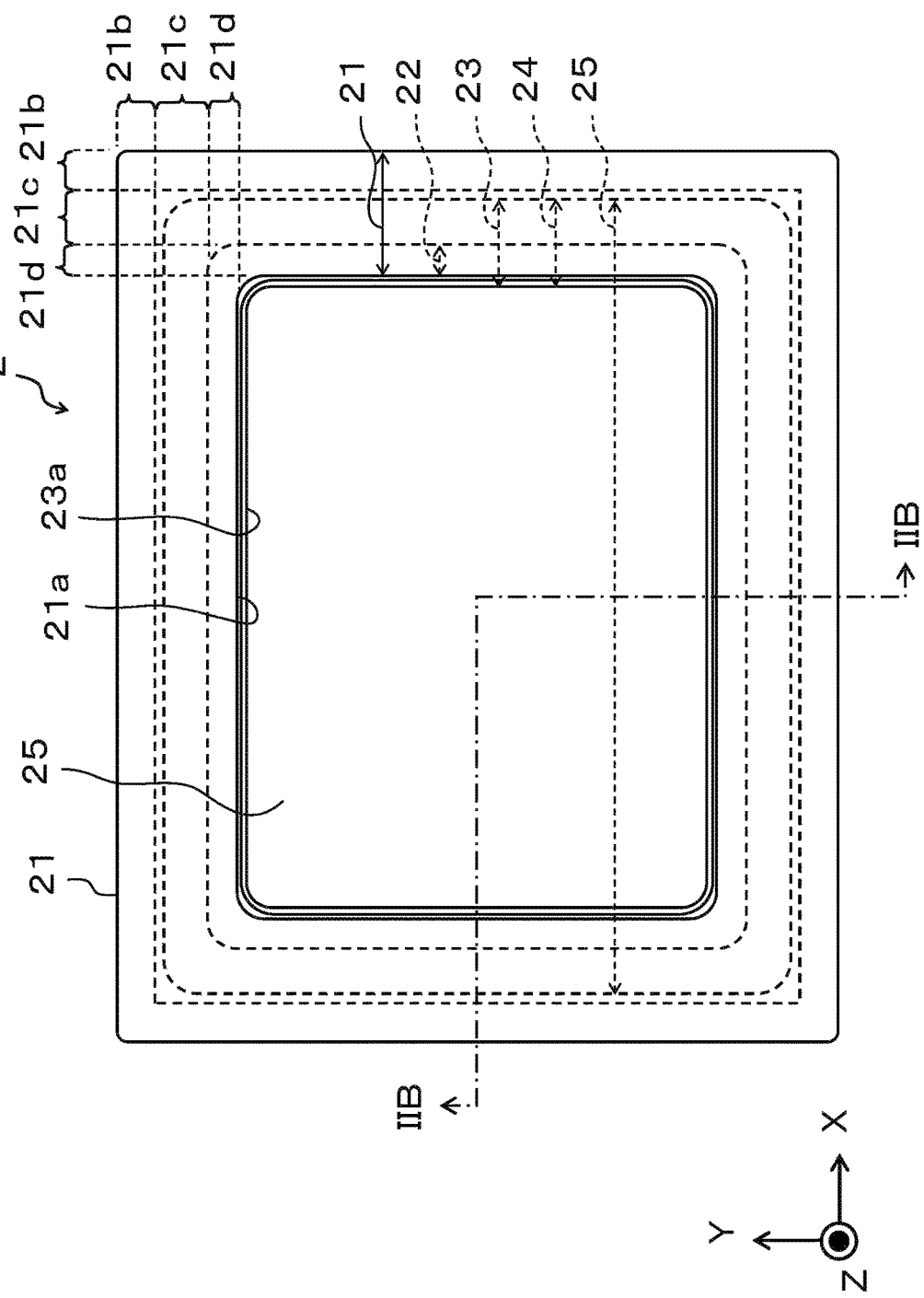

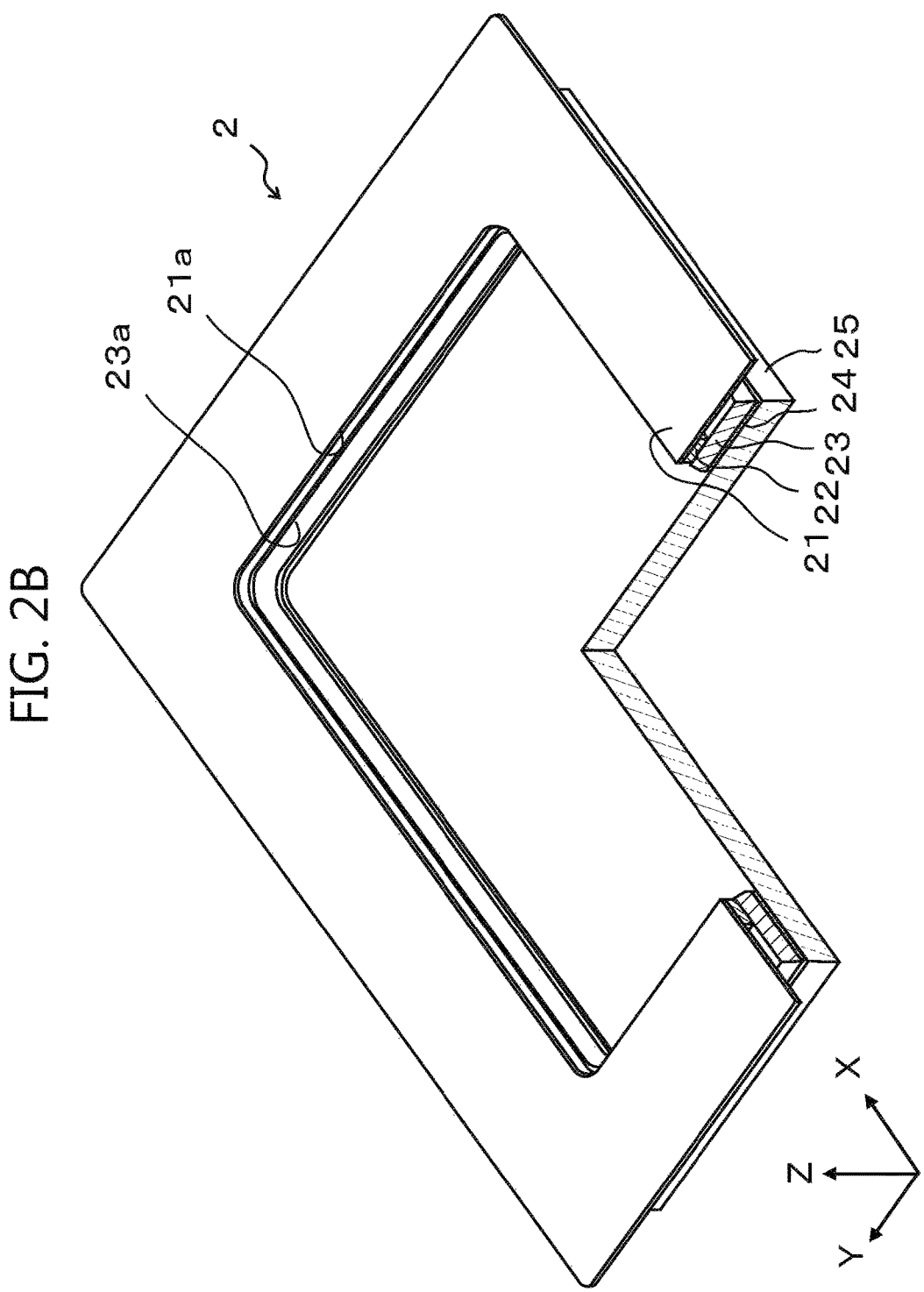

LIGHT EMITTING DEVICE

CROSS-REFERENCE TO RELATED APPLICATIONS

The present application claims priority under 35 U.S.C. § 119 to Japanese Patent Application No. 2016-254214, filed on Dec. 27, 2016, the contents of which are hereby incorporated by reference in their entirety.

BACKGROUND

1. Field of the Invention

The present disclosure relates to a light-emitting device.

2. Description of Related Art

There has been proposed an optical device in which optical elements such as a light-emitting element and a mirror device are mounted in a recess of a package, and in which the optical elements are hermetically sealed by a cover member having a glass member serving as a window through which light is incident or emitted (see, for example, Japanese Patent Publication No. 2015-195330, hereinafter referred to as patent literature 1, and Japanese Patent Publication No. 2006-66645, hereinafter referred to as patent literature 2). The hermetical sealing is performed to provide stable operations of the optical elements.

As an example, FIG. 5 shows the optical device illustrated in FIG. 11(a) of patent literature 1. Reference signs used in FIG. 5 have been changed from the original reference signs indicated in FIG. 11(a) of patent literature 1 by adding a value of 1000 for convenience. The optical device shown in FIG. 5 includes: an optical device base 1001 serving as a package having a recess 1011a, an optical element 1002 mounted in the recess 1011a, and a cover member 1003 disposed on an upper side of the optical device base 1001. The optical device base 1001 includes: an insulator 1011 serving as a base, and a metal ring 1012 disposed near an outer edge portion of the insulator 1011 such as to surround the recess 1011a, in which the optical element 1002 is mounted. The cover member 1003 includes: in order from an outer side, a metal frame 1031, a frame-shaped member 1032 brazed to a lower surface of the metal frame 1031 using a brazing material 1035, a glass member 1033 bonded to a step 1032b of the frame-shaped member 1032 having an L-shape in cross-sectional view using a glass bonding material 1034. The optical element 1002 is hermetically sealed by seam welding the metal ring 1012 of the optical device base 1001 and the metal frame 1031 of the cover member 1003 to each other.

An optical element housing package described in patent literature 2, illustration of which in the present application is omitted, is constituted by a base having a recess in which an optical element is mounted and a cover body disposed so as to close an opening of the base. The cover body includes: a first frame body holding a window body constituted by a glass plate, and a second frame body that connects the first frame body to the base. The first frame body has a step having an inverted L-shape in cross-sectional view. The window body is bonded to the step using a first sealing material such as a low-melting point glass. The cover body thus having a two-tier configuration composed of the first and second frame bodies is seam-welded to a side wall of the recess of the base, to thereby hermetically seal the optical element in the recess.

SUMMARY

The optical device packages described in patent literatures 1 and 2 are devised to reduce the thermal stress or residual stress which is generated by bonding the members constituting the package and cover member to each other by a method involving heating, such as welding or brazing in manufacturing the optical device packages.

Hereinafter, description is given of a case of the optical device described in patent literature 1 in which a light-emitting element, in particular a semiconductor laser element or a light-emitting diode that generates a large amount of heat in operation, is mounted in the package as the optical element, with reference to FIG. 5.

Generally, the light emission efficiency of a light-emitting element decreases as temperature increases. Thus, dissipation of the heat generated by the light-emitting element is a matter of concern. In the optical device described in patent literature 1, the optical element is mounted on the insulator 1011. However, in order to increase heat dissipation, use of a metal having good thermal conductivity is preferred for the package. In general, metal has a high thermal expansion coefficient. Thus, heat generated by operation of the light-emitting element causes thermal expansion of the package. In this event, as indicated by the white arrow in FIG. 5, a stretching stress is outwardly applied to the metal frame 1031 bonded to the metal ring 1012, which is a part of the package for bonding. This also causes a stretching stress to be outwardly applied to an upper surface of the frame-shaped member 1032 connected with the metal frame 1031. Further, this also causes a stretching stress to be outwardly applied via the frame-shaped member 1032 to the glass member 1033 and the glass bonding material 1034.

That is, when a light-emitting element is mounted as the optical element, thermal expansion of the package causes stress to be applied to the glass member 1033 and the glass bonding material 1034. The application of stress may cause the glass member 1033 and the glass bonding material 1034 to break or separate from the frame-shaped member 1032. As shown in FIG. 5, the frame-shaped member 1032 has: a flat surface that is parallel with the XY plane and supports the glass member 1033, and a side wall 1032c which rises from the flat surface and is bonded to the metal frame 1031. The package thus configured may have an insufficient bonding strength between an inner surface of the side wall 1032c defining a portion of the step 1032b and the glass bonding material 1034 as well as between the glass bonding material 1034 and the glass member 1033. In this case, the glass member 1033 is bonded substantially only to the flat surface of the frame-shaped member 1032. Then when a stretching stress is outwardly applied to the metal frame 1031, an upper end of the side wall 1032c is stretched outwardly while the flat surface is fixed. This results in concentration of stress on a corner where the flat surface and the side wall 1032c of the frame-shaped member 1032 intersect, i.e., a corner of the step 1032b. The concentrated stress requires release, which may cause breakage, separation, and/or the like of members. However, the frame-shaped member 1032 is made of a hard ceramic material and thus is unlikely to deform or break. On the other hand, the glass bonding material 1034 is for example made of a low-melting point glass and is more fragile than the frame-shaped member 1032. For this reason, before the corner of the step 1032b of the frame-shaped member 1032 breaks, the glass bonding material 1034 disposed at the step 1032b is likely to have damage such as a crack, or is likely to separate from the frame-shaped member 1032 or glass member 1033.

The damage or separation of the glass bonding material 1034 degrades the hermetic properties of the package, which may cause reliability problems, such as a decrease in the light emission output of the light-emitting device due to dust entering in the sealed space. In particular, when many light-emitting elements are mounted, the amount of heat generation increases and thus the resulting stress increases, which is likely to reduce the reliability of the light-emitting device.

Hereinafter, consideration is made with respect to a case of the optical device described in patent literature 2 in which a light-emitting element is mounted as the optical element. In this light emitting device, the light-emitting element generates heat and thus the base thermally expands, thereby generating stress such that the window body is warped in a convex shape. That is, stress is applied to a corner of the first frame body such that the window body and the first sealing material separate from the first frame body. This may cause the window body, which is a glass plate, and/or the first sealing material using a low-melting point glass to be broken.

The embodiments according to the present disclosure can improve reliability of light-emitting devices in which a plurality of light-emitting elements are mounted and hermetically sealed.

A light-emitting device according to one embodiment of the present disclosure includes: a package made of a metal material and defining a recess, the package comprising a side wall defining a side of the recess; a plurality of light-emitting elements disposed in the recess; and a cover member disposed so as to close an opening of the recess. The cover member includes: a light-transmitting member having a primary surface, a ceramic member having a loop-shape and having a first surface and a second surface opposite the first surface, the first surface bonded to the primary surface of the light-transmitting member via a bonding material, and a metal member having a loop-shape and including: a first portion bonded to the second surface of the ceramic member, and a second portion located outward of the first portion in a plan view and joined to an upper surface of the side wall of the package.

The embodiments according to the present disclosure may improve reliability of light-emitting devices in which a plurality of light-emitting elements are mounted and hermetically sealed.

BRIEF DESCRIPTION OF THE DRAWINGS

A more complete appreciation of embodiments of the invention and many of the attendant advantages thereof will be readily obtained by reference to the detailed description below when considered in connection with the accompanying drawings.

FIG. 1B is a cross-sectional view taken along line IB-IB in FIG. 1A, showing the configuration of the light-emitting device according to the embodiment.

FIG. 2A is a plan view showing a configuration of a cover member of the light-emitting device according to the embodiment.

FIG. 2B is a partially cross-sectional, perspective view of the cover member of the light-emitting device according to the embodiment, wherein the cross-sectional view is taken along line IIB-IIB in FIG. 2A.

DETAILED DESCRIPTION

Hereinafter, a description is given of a light emitting device according to an embodiment of the present disclosure.

The drawings referenced in the following description schematically show the embodiment. Thus, the scale of members, distances between members, positional relations between members or the like may be presented in an exaggerated manner, and illustration of a part of a member may be omitted. Furthermore, the scale and distances between members may not match between a plan view and its corresponding cross-sectional view. In the description below, members that are the same or analogous are given the same name or number in principle, and duplicative detailed descriptions are appropriately omitted.

It is to be noted that, in a light emitting device according to the embodiment, interpretation of directions such as "up", "down", "left", and "right" should be interchanged according to the situation. It is to be noted that, directions like "up" and "down" are used to represent relative positions between constituent elements in a drawing referenced for explanation and are not intended to specify the absolute positions unless otherwise stated.

Figure 1A:
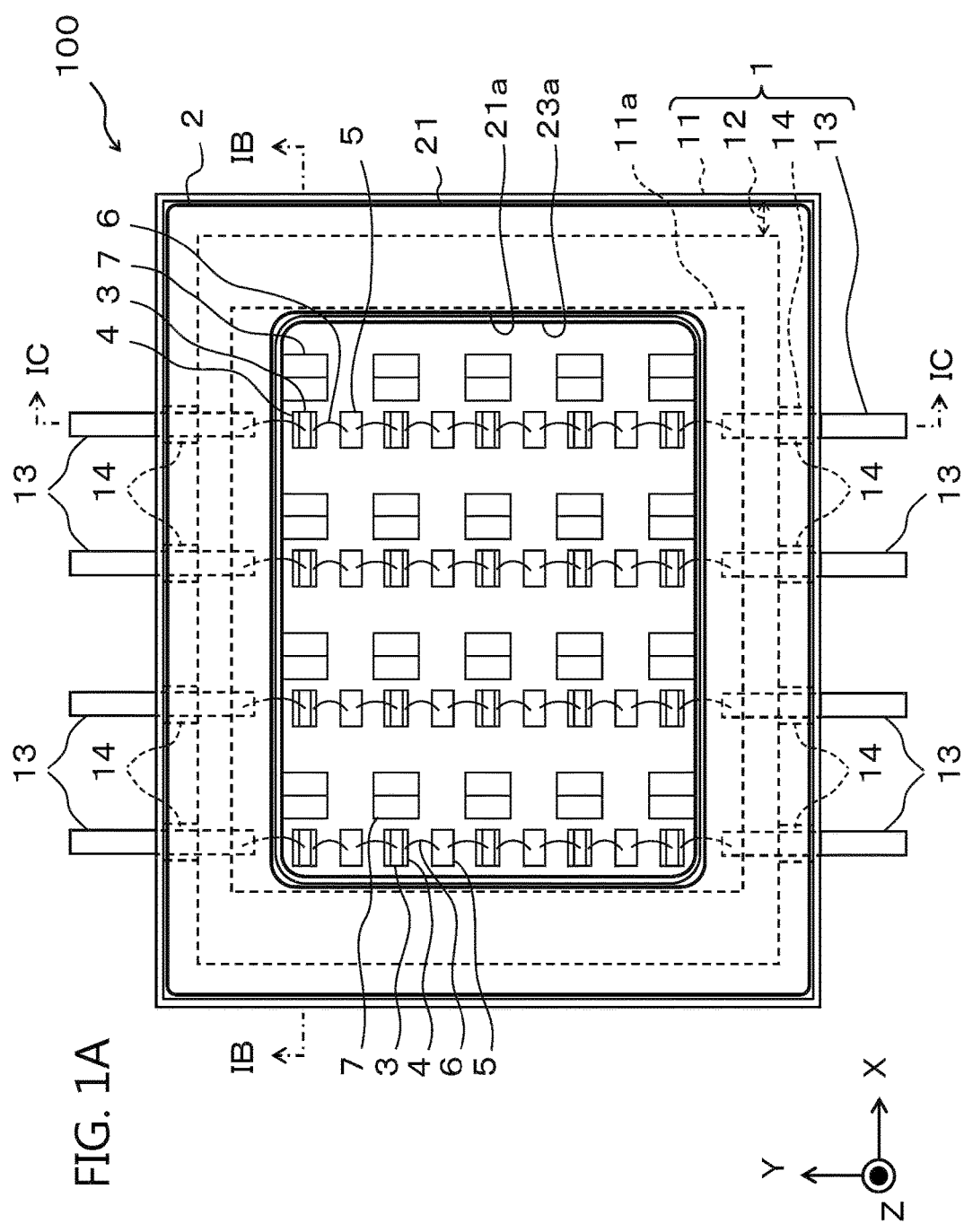
FIG. 1A is a plan view showing a configuration of a light-emitting device according to an embodiment.

Coordinate axes are shown in FIGS. 1A to 2B and 3A to 4. For convenience, a principal surface of a light-transmitting member 25, which serves as a light extraction surface of a light-emitting device, and a surface on which light-emitting elements 3 are disposed in a package are shown in parallel with the XY-plane. The positive direction along the X-axis corresponds to the direction in which the light-emitting elements 3 emit light. A direction perpendicular to the light-extraction surface corresponds to the Z-axis direction; and the light extraction direction corresponds to the positive direction along the Z-axis. FIGS. 1A and 2A are each a plan view observing in the negative direction along the Z-axis.

Configuration of Light Emitting Device

A description is given of a light-emitting device according to an embodiment of the present disclosure with reference to FIGS. 1A to 2B.

The light-emitting device 100 according to the present embodiment has a substantially rectangular parallelepiped shape and includes: a package 1 having a recess 1a having an open end, the open end defining an opening of the package 1 at an upper side thereof; a cover member 2 disposed so as to close the opening of the package 1; and a plurality of light-emitting elements 3e, submounts 4, relay members 5, wires 6, and light-reflecting members 7, which are disposed in the recess. Light emitted by the light-emitting elements 3 passes through a light-transmitting member 25 disposed in the cover member 2 at a center portion thereof, and is extracted to the outside. A plurality of terminals 13 for connection with an external power supply are disposed in the light-emitting device 100 such that the terminals 13 project from a side surface of the package 1.

Hereinafter, each member is described in detail.

The package 1 includes: a flat-plate-shaped base 11 having an upper surface on which the light-emitting elements 3 are disposed; a side wall 12 disposed so as to surround an area of the upper surface of the base 11 where the light-emitting elements 3 are disposed; and the plurality of terminals 13 disposed so as to penetrate the side wall 12 and project therefrom inside and outside the package 1. In the package 1, the recess 1a has the open end at the upper side of the package 1, and the upper surface of the base 11 and an inner surface of the side wall 12 respectively define a bottom surface and a side surface of the recess 1a.

The base 11 is made up of a metal plate having a rectangular shape in a plan view. The base 11 has a centrally located raised portion 11a having an upper surface higher than an outer edge portion of the base 11. The upper surface of the raised portion 11a is the area where the light-emitting elements 3 are disposed. Alternatively, the base 11 may be of a flat plate shape with a constant thickness, unlike the present embodiment in which the base 11 has the raised portion 11a. The upper surface of the raised portion 11a, on which the light-emitting elements 3 are mounted, is located higher than a portion of the base 11 to which the side wall 12 is joined. With this configuration, the side wall 12 may have a height sufficient to hold the terminals 13, and, at the same time, a distance from emission surfaces of the light-emitting elements 3 to the light-transmitting member 25 may be shortened.

On the upper surface of the raised portion 11a, the plurality of light-emitting elements 3 are disposed via submounts 4 in a two-dimensional pattern. In addition, relay members 5 are each disposed between adjacent submounts 4 in the Y-axis direction. In addition, for each of the light-emitting elements 3, a light-reflecting member 7 is spaced apart from the light-emitting element 3 in the positive direction along the X-axis direction, in which direction a light emission surface of the light-emitting element 3 is oriented.

The side wall 12 is disposed at the outer edge portion of the base 11 in a loop shape such as to, in a plan view, surround the raised portion 11a, on which the light-emitting elements 3 are disposed. The side wall 12 includes two opposite wall portions facing each other in the Y-axis direction and each having through-holes penetrating in a thickness direction of the wall portions. In each of the through-holes, one of the terminals 13 is inserted through and fixed by using an insulating member 14. In the present embodiment, four through-holes are formed in each of the opposite wall portions of the side wall 12. In the present specification, a "loop shape" specifically means a closed-loop shape, the plan view shape of which may take various shapes, including a circular shape, a polygonal shape such as a rectangle, and a rounded polygonal shape. For a case in which the light-emitting elements 3 are disposed in a matrix form as shown in FIG. 1A, the side wall 12 may suitably have a rectangular loop shape or a rounded rectangular loop shape.

A lower surface of the side wall 12 is joined to the base 11 by, for example, brazing using a silver brazing material or the like. An upper surface of the side wall 12 is joined to a lower surface of a metal member 21 of the cover member 2. The joining of the base 11 and the side wall 12 may be achieved by soldering, thermal compression, welding or the like. Optionally, the package 1 may be prepared by integrally forming the base 11 and the side wall 12 by casting or cutting a thick sheet metal, for example.

Preferably, a material having good thermal conductivity is used for the base 11. Examples of the material for the base 11 include: Cu, Cu—W alloys, Cu—Mo alloys, Ag, Ag alloys, Al, and Al alloys. Use of such a material having comparatively high thermal conductivity for the base 11 allows efficient dissipation of the heat generated by the light-emitting elements 3. Preferably, the side wall 12 is made of a material having a thermal expansion coefficient similar to that of the base 11 and capable of being welded to the metal member 21. Examples of the material for the side wall 12 include metal materials such as iron alloys.

The terminals 13 are disposed so as to penetrate the side wall 12 defining the side surface of the package 1 and project inside and outside the recess 1a. In the present embodiment, the terminals 13 are provided in pairs, one for each set of five light-emitting elements 3 disposed in the Y-axis direction, which totals eight terminals 13. Each pair of the terminals 13 is used to electrically connect the corresponding set of five light-emitting elements 3, which are electrically connected in series, with an external power source in order to supply power to the light-emitting elements 3.

Each of the terminals 13 is fixed to the corresponding through-hole of the side wall 12 via the corresponding insulating member 14 so as not to conduct electricity with the side wall 12. The insulating member 14 is disposed so as to hermetically seal the through-hole through which the terminal 13 is inserted.

Preferably, the material of the terminals 13 and the material of the insulating members 14 have similar thermal expansion coefficients, so that, while the light-emitting device 100 is in operation, the hermetic sealing may be maintained even when the package 1 thermally expands due to the heat generated by the light-emitting elements 3.

Examples of the material for the terminals 13 include KOVAR® (Fe—Ni—Co alloy) and Fe—Ni alloys. Examples of the material for the insulating members 14 include glass bonding materials such as a low-melting point glass, e.g., a borosilicate glass.

The terminals 13 may each be disposed at any portion of the periphery of the light-emitting device 100. However, the terminals 13 are preferably disposed on the side surface of the package 1, like the present embodiment. In other words, the terminals 13 are preferably not disposed on the lower surface of the package 1. Not disposing the terminals 13 on the lower surface of the package 1 allows using the entire lower surface of the package 1 as a mounting surface. With this configuration, the light-emitting device 100 can have good heat dissipation even though the plurality of light-emitting elements 3, which generate heat, are disposed in one package 1 like the present embodiment.

When the terminals 13 are disposed on the side wall 12 of the package 1, the side wall 12 needs to have a certain height. This means that the light-emitting elements 3 and the like disposed on the base 11 are spaced apart further from the light-transmitting member 25 than when the terminals 13 are not disposed on the side wall 12. However, even in such a case, because the base 11 has the above-described raised portion 11a, the light-emitting elements 3, the light-reflecting members 7 and the like can be disposed near the light-transmitting member 25.

As shown in FIGS. 2A and 2B, the cover member 2 in the present embodiment is constituted by, in order from top, the metal member 21 having a loop shape, an intermediate member 22 having a loop shape, a ceramic member 23 having a loop shape, and the light-transmitting member 25 having a flat plate shape, bonded one after another. The light-transmitting member 25 and the ceramic member 23 are bonded to each other using a bonding material 24. This configuration reduces stress applied to the bonding material 24, and thus improves the reliability of the light-emitting device 100 in which the light-emitting elements 3 are hermetically sealed. Hereinafter, description is given as to this feature.

In the present embodiment, a lower surface of the metal member 21 and an upper surface of the ceramic member 23 are bonded to each other via the intermediate member 22; and a lower surface of the ceramic member 23 and an upper surface of the light-transmitting member 25 are bonded to each other with the bonding material 24. In other words, a surface of the ceramic member 23 on which the bonding material 24 having a comparatively low breaking strength is disposed is located opposite a surface of the ceramic member 23 on which the intermediate member 22 having a comparatively high breaking strength is disposed. Further, the ceramic member 23 does not have a step like the one shown in FIG. 5, to which stress is likely to be concentrated. Therefore, it is unlikely that stress is transferred to the bonding material 24, and thus the reliability of the light-emitting device 100 may be improved.

Each adjacent members in the members constituting the cover member 2 are bonded to each other in a loop-shaped region, along the entire length of the adjacent members. Meanwhile, the metal member 21 has an outer edge portion located around the entire outer contour of the metal member 21. The entire length of the outer edge portion is joined by welding or the like to the upper surface of the side wall 12 defining the side surface of the recess 1a. The bonding and joining of those members thus described achieve hermetic sealing of the upper opening of the recess 1a. In the light-emitting device 100, hermetically sealing the light-emitting elements 3 prevents dust from depositing in areas where a high-density light irradiates around the light-emitting elements 3.

The metal member 21 is made up of a loop-shaped metal plate having a centrally located opening 21a in a plan view. The metal member 21 holds the light-transmitting member 25 via the intermediate member 22 and the ceramic member 23. In the plan view, the loop-shaped metal member 21 has an outer contour substantially the same as or slightly smaller than that of the side wall 12 of the package 1, and has an inner contour corresponding to the opening 21a and including the area where the light-emitting elements 3 are disposed. In addition, the metal member 21 is located such as to be superposed on the upper surface of the side wall 12 of the package 1 in the plan view. The outer edge portion of the metal member 21 is joined to the upper surface of the side wall 12 by seam welding or the like. Optionally, the joining between the metal member 21 and the side wall 12 may be by another joining process such as brazing. However, seam welding is preferred because it allows strong joining to hermetically seal the light-emitting elements 3.

The metal member 21 may have, in the plan view, an outer contour larger than that of the side wall 12 of the package 1. In such a case, however, performing seam welding involves pressing a roller electrode on a portion of the metal member 21 that projects from the side wall 12 in addition to the side wall 12. This may cause a non-pressed portion of the metal member 21 to be separated off from the side wall 12. Therefore, to reliably avoid poor welding, the metal member 21 preferably has an outer contour identical to or smaller than the outer contour of the side wall 12 in the plan view.

The metal member 21 is joined to the upper surface of the side wall 12 of the package 1 in a loop-shaped region 21b located near and around the entire length of the outer contour of the metal member 21, and bonded via the intermediate member 22 to the ceramic member 23 in a loop-shaped region 21d located near and around the entire length of the inner contour of the metal member 21. The metal member 21 has a loop-shaped region 21c as a non-bonding region where the metal member 21 is not bonded to any another member, between the region 21d and the region 21b. As understood from the description above, the metal member 21 is bonded above a side of the ceramic member 23 opposite the surface thereof to which the light-transmitting member 25 is bonded.

In the metal member 21, when the light-emitting device 100 is in operation, the thermal stress due to the heat generated by the light-emitting elements 3 may be relaxed by deformation of the region 21c, resulting in a reduction in the stress applied to the ceramic member 23, the bonding material 24, and the light-transmitting member 25. Therefore, the region 21c of the metal member 21 preferably has a small thickness. Specifically, a thickness of 200 μm or less is preferred. Meanwhile, the region 21c preferably has a certain thickness to allow holding the light-transmitting member 25 and other members. Specifically, a thickness of 50 μm or more is preferred.

Preferably, the metal member 21 has a thermal expansion coefficient similar to those of the ceramic member 23, the bonding material 24, and the light-transmitting member 25. Examples of such a material include: Fe—Ni—Co alloys such as KOVAR®, and Fe—Ni alloys. The metal member 21 may be made of an Fe—Ni—Co alloy or Fe—Ni alloy mentioned above as a base material, and may have a surface plated with a metal such as Ni.

The metal member 21 may be dimensioned, for example, such that a longer side of the outer contour of the metal member 21 has a length of 30 mm and a longer side of the opening 21a has a length of 20 mm in a plan view. In a case in which the metal member 21 is joined to the side wall 12 of the package 1 by welding, the metal member 21 may have a thickness of about 50 μm to about 200 μm, from the viewpoints of weldability and the aforementioned relaxation of thermal stress.

The intermediate member 22 is made up of a loop-shaped metal sheet that is disposed so as to be interposed between the metal member 21 and the ceramic member 23. The intermediate member 22 is disposed, in a plan view, within the area of the ceramic member 23, in a loop-shaped region located inwardly from the outer contour of the ceramic member 23.

The intermediate member 22 is disposed for two purposes.

The first purpose is to enable an active brazing material suitable for bonding the ceramic member 23 to exhibit sufficient bonding strength.

The metal member 21 is a member welded to the side wall 12. When bonding such metal member 21 directly to the ceramic member 23 with an active brazing material, sufficient bonding strength may not be obtained. For this reason, it is preferable to dispose the intermediate member 22 and bond the intermediate member 22 to the ceramic member 23 with an active brazing material containing an active metal such as Ti, Hf, Zr, or hydride of any of the foregoing. With this configuration, the active metal component in the active brazing material forms a fine layer on a surface of the ceramic member 23, which may provide high bonding strength. In this case, the intermediate member 22 is preferably made of copper, in particular, a high-purity copper. Examples of such a high-purity copper include an oxygen free copper of a purity of 99.95% or more and a tough pitch copper of a purity of 99.9% or more.

The second purpose of using the intermediate member 22 is to define the region 21d, where the flat lower surface of the metal member 21 is bonded to the flat upper surface of the ceramic member 23, in a region located inwardly from the outer contour of the ceramic member 23. That is, the second purpose is to enlarge the region 21c, a non-bonding region where the metal member 21 is not bonded to any other member. The non-bonding region 21c can deform when stress is applied, to relax the stress. This means that the larger the region 21c, the more effectively the stress will be relaxed. For the purpose of relaxing the stress, the intermediate member 22 is preferably disposed within the area of the ceramic member 23 in a plan view, and such that an outer contour of the intermediate member 22 is located inwardly from the outer contour of the ceramic member 23 in the plan view. Moreover, the intermediate member 22 is preferably disposed so as to be within a region located inwardly from the middle between the inner and outer contours of the ceramic member 23 in the plan view.

The intermediate member 22 may be disposed such that the inner contour thereof is substantially coincident with the inner contours of the metal member 21 and the upper surface of the ceramic member 23 in a plan view, as in the present embodiment. This configuration is suitable not to block light from the light-transmitting member 25, and, at the same time, enlarges the bonding area where the intermediate member 22 and the metal member 21 are bonded to each other and the bonding area where the intermediate member 22 and the ceramic member 23 are bonded to each other.

A thinner intermediate member 22 is considered more favorable for the stress relaxation. Specifically, the intermediate member 22 may have a thickness of 500 μm or less. In addition, the intermediate member 22 may have a thickness of 10 μm or more.

Because the metal member 21 and the intermediate member 22 are both made of a metal material, they are readily and firmly joined to each other by brazing, thermal compression, welding, or the like. The intermediate member 22 may be formed as a plated layer formed on the lower surface of the metal member 21 by electroplating or the like.

Alternatively, a metallized layer may be formed on the bonding surface of the ceramic member 23 using a metal material such as Ni, Au, Ag, or Cu, and the metal member 21 may be joined to the metallized layer of the ceramic member 23 using a brazing material not containing an active metal. In this case, the intermediate member 22 is not necessary in terms of the first purpose.

In addition, like first and second variant embodiments described later, a raised portion may be formed on the lower surface of the metal member 21 or on the upper surface of the ceramic member 23 to narrow the region 21d, where the metal member 21 is joined to the ceramic member 23. In this case, the intermediate member 22 for the second purpose may be omitted.

The ceramic member 23 is made up of a loop-shaped, frame-like ceramic plate having a centrally located opening 23a in a plan view, and holds the light-transmitting member 25 via the bonding material 24. Preferably, the ceramic member 23 is formed using a material having light-blocking properties. Such a ceramic member 23 also serves as a light-blocking member that blocks stray light irradiating regions other than the opening 23a of the ceramic member 23. Herein, the "material having light-blocking properties" means a material having a lower light transmissivity than the light-transmitting member 25 for the light from the light-emitting elements 3. Examples of such a material include: white ceramics, ceramics of a dark color such as black, and other ceramics of a yellow color or the like. The opening 23a of the ceramic member 23 may have an inner surface the entirety of which is a vertical plane or an inclined plane. In the present embodiment, the inner surface of the opening 23a has a lower portion whose surface is substantially vertical and has an upper portion whose surface is inclined such that the opening 23a has a larger opening area at an upper position. That is, the ceramic member 23 is structured so as to facilitate extraction of light when the light-emitting elements 3 emit diverging light whose beam diameter increases as the light propagates.

Preferably, the ceramic member 23 is made of a material having a thermal expansion coefficient similar to those of the light-transmitting member 25 and the bonding material 24. This may effectively reduce separation and breakage of the light-transmitting member 25 and the bonding material 24.

The ceramic member 23 may be formed of an alumina ($Al_2O_3$) sintered body or an aluminum nitride (AlN) sintered body, for example. In addition, preferably, the material for the ceramic member 23 has higher rigidity (a higher Young's modulus and/or higher fracture toughness) than the light-transmitting member 25, which may lower the stress applied to the light-transmitting member 25.

The ceramic member 23 may be formed by pressing a powder material using a mold to form an article having an external shape and then sintering the article.

The ceramic member 23 may have a thickness of about 100 μm or more so as to have enough rigidity to hold the light-transmitting member 25. In addition, the ceramic member 23 may have a thickness of about 700 μm or less to limit an increase in the total thickness of the cover member 2.

In the present embodiment, the ceramic member 23 is disposed such that the outer contour of the ceramic member 23 substantially coincides with the outer contour of the light-transmitting member 25 in a plan view. Alternatively, the ceramic member 23 may be disposed such that the outer contour of the ceramic member 23 is located inwardly from the outer contour of the light-transmitting member 25 in the plan view. However, the ceramic member 23 is preferably disposed such that those outer contours substantially coincide with each other or the outer contour of the ceramic member 23 is located outwardly from the outer contour of the light-transmitting member 25 in the plan view. With this conditions, as far as using the same light-transmitting member 25 and a ceramic member 23 having the same inner contour, the area of the region where the ceramic member 23 is bonded via the bonding material 24 to the light-transmitting member 25 can be made larger.

The light-transmitting member 25 is a member that transmits light emitted from the light-emitting elements 3. The bonding material 24 is a member for bonding the ceramic member 23 and the light-transmitting member 25 to each other. The light-transmitting member 25 may be a plate-shaped member having light transmissive properties. For example, the external shape of the light-transmitting member 25 may be a substantially rectangular parallelepiped shape. Alternatively, when the ceramic member 23 has an annular ring shape, the light-transmitting member 25 may be of a cylindrical shape. The light-transmitting member 25 is not limited to a plate-shaped member. For example, the light-transmitting member 25 may have a convex or concave lens portion.

The light-transmitting member 25 is disposed so as to close the opening 21a of the metal member 21 and the opening 23a of the ceramic member 23, to constitute a window in the cover member 2 through which the light emitted by the light-emitting elements 3 is extracted. A loop-shaped outer periphery portion of the upper surface of the light-transmitting member 25 is bonded via the bonding material 24 to the substantial entirety of the lower surface of the ceramic member 23. Unlike the frame-shaped member 1032 shown in FIG. 5, the ceramic member 23 does not have a surface that extends toward the metal member 21 from the surface to which the light-transmitting member 25 is bonded via the bonding material 24. Thus, it can be said that, unlike the frame-shaped member 1032 shown in FIG. 5, the ceramic member 23 does not have a corner to which stress is likely to be concentrated, i.e., a corner of an upwardly facing step. Therefore, the above-described configuration may reduce possibility of damage of the bonding material 24, such as breakage or separation from the ceramic member 23 or the light-transmitting member 25, even when stress due to the heat generated by the light-emitting elements 3 is applied.

The light-transmitting member 25 may be made of a material having good light-transmissive properties in the wavelength range of the light emitted by the light-emitting elements 3. Examples of such a material include glass materials and single crystal materials. In addition, preferably, the material for the light-transmitting member 25 has an thermal expansion coefficient similar to those of the ceramic member 23 and the bonding material 24. This selection of the material for the light-transmitting member 25 may reduce the possibility of birefringence and/or breakage of the light-transmitting member 25, and improve the reliability of the light-emitting device 100 in a temperature cycling environment or the like. For example, the light-transmitting member 25 is preferably made of a material having a thermal expansion coefficient of $4 \times 10^{-6}$/K to $8 \times 10^{-6}$/K. Examples of the glass materials include BK7 (manufactured by HOYA CORPORATION; thermal expansion coefficient: approx. $7.5 \times 10^{-6}$/K) and D263(R) (manufactured by SCHOTT Corporation; thermal expansion coefficient: approx. $7.2 \times 10^{-6}$/K). Examples of the single crystal materials include sapphire (thermal expansion coefficient: $7.7 \times 10^{-6}$/K).

The light-transmitting member 25 may have a thickness of about 10 μm to about 1.5 mm.

The light-transmitting member 25 illustrated in FIGS. 1A to 2B has a rectangular parallelepiped shape. However, ridges of the rectangular parallelepiped shape may be chamfered by C-chamfering or R-chamfering. This may allow reduction in the possibility of breakage of the light-transmitting member 25, such as a fracture originating from a fine crack that occurs in a ridge during a cutting process.

Incidentally, in FIGS. 1A to 2B, only one light-transmitting member 25 is provided in one light-emitting device 100. This configuration makes the cover member 2 have a larger light extraction surface compared to a case in which a cover member is configured to have a plurality of windows for each of which a light-transmitting member is disposed. Meanwhile, it is likely that the larger the size of the light-transmitting member 25, the greater the stress applied to the light-transmitting member 25. Thus, the structure of the cover member 2 of the present embodiment is suitable to that configuration. In addition, when a plurality of windows are provided in a cover member, a plurality of light-emitting elements need to be disposed in respective locations so that light from each of the plurality of light-emitting elements may be extracted through a corresponding one of the plurality of windows. However, such a configuration is not necessary when only one light-transmitting member 25 is used. Moreover, when only one light-transmitting member 25 is used, the plurality of light-emitting elements 3 may be disposed in an annular form rather than in a matrix form.

Incidentally, the upper surface and/or the lower surface of the light-transmitting member 25 may be coated with anti-reflection (AR) coating, which may enhance light extraction efficiency of the light-emitting device 100.

Preferably, the bonding material 24 is made of a glass bonding material.

The bonding material 24 made of a glass bonding material is unlikely to be subject to degradations such as alteration or discoloration, in particular, even when semiconductor laser elements that emit high-density light or LED elements that emit ultraviolet light are used as the light-emitting elements 3 and the bonding material 24 is irradiated with light from the light-emitting elements 3. Therefore, the use of a glass bonding material improves reliability of the light-emitting device 100. In addition, the use of a glass bonding material, especially, a low-melting point glass, for the bonding material 24 is preferable also for the reason that good bonding characteristics are obtained when bonding the ceramic member 23 and the light-transmitting member 25 made of a glass material to each other. When using a glass bonding material for the bonding material 24: in a case in which the light-transmitting member 25 is made of a glass material, a glass bonding material having a lower softening point than the light-transmitting member 25 may be used. When the light-transmitting member 25 is made of a crystal material, a glass bonding material having a lower melting point than the light-transmitting member 25 may be used. Preferably, the bonding material 24 has a thermal expansion rate similar to those of the light-transmitting member 25 and the ceramic member 23, which may reduce the stress applied on the light-transmitting member 25 and the ceramic member 23 in the event of a temperature change, and thus may improve reliability of the light-emitting device 100.

Examples of the low-melting point glass include a bismuth-based lead-free glass bondable at a temperature as low as 450° C. or a vanadium-based lead-free glass bondable at a temperature as low as 400° C.

Figure 5:
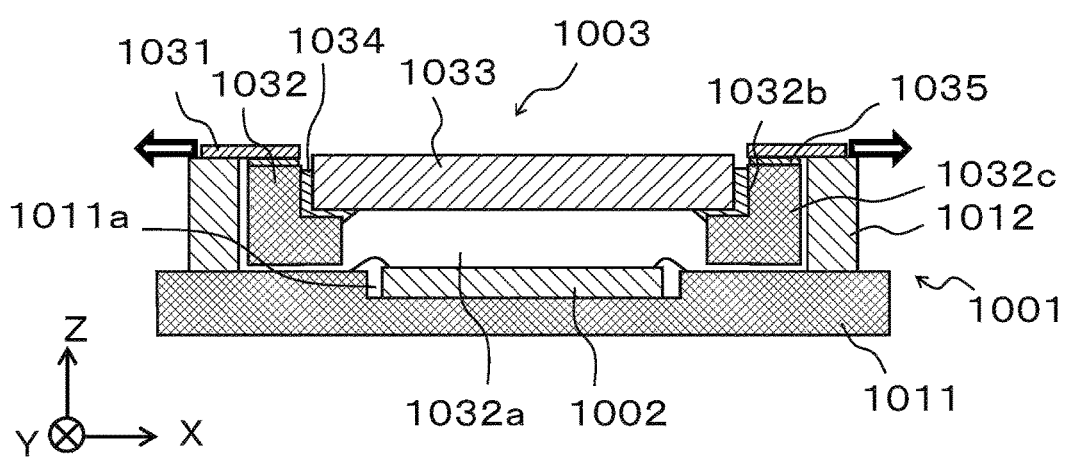
FIG. 5 is a cross-sectional view showing a configuration of an optical device according to a prior art.

Preferably, the bonding material 24 is interposed only between the upper surface of the light-transmitting member 25 and the lower surface of the ceramic member 23, which is substantially parallel with the upper surface of the light-transmitting member 25. For example, as shown in FIG. 5, the glass bonding material 1034 has a portion interposed between a side surface of the glass member 1033 and an inner side surface of the frame-shaped member 1032. Such a portion tends to have a lower bonding strength than the other portion of the glass bonding material 1034. This is because, whereas it is possible to press a portion of the glass bonding material 1034 disposed on the lower surface of the glass member 1033 to the frame-shaped member 1032, it is difficult to press the portion of the glass bonding material 1034 disposed on the side surface of the glass member 1033 to the frame-shaped member 1032. The portion of the glass bonding material 1034 having a lower bonding strength is more likely to separate or break than the other portion of the glass bonding material 1034. Such a portion having a low bonding strength can be eliminated by disposing the bonding material 24 only in a region where the bonding material is readily pressed, specifically, only between the upper surface of the light-transmitting member 25 and the lower surface of the ceramic member 23. Therefore, the present embodiment may lead to reduction in possibility of separation or breakage of the bonding material 24.

In the present embodiment, the cover member 2 is configured such that the light-transmitting member 25 is situated in the recess 1a. This configuration serves to reduce possibility of breakage or disfigurement of the light-transmitting member 25 due to physical contact with an object while the light-emitting device 100 is being handled to be mounted on a board or embedded in a device such as a projector.

In addition, disposing the light-transmitting member 25 in a lower layer of the cover member 2 shortens the distance between the light-transmitting member 25 and the light-emitting elements 3.

Hereinafter, a description is given as to an advantage of the shortened distance between the light-transmitting member 25 and the light-emitting elements 3 with reference to FIG. 5.

As shown in FIG. 5, in a light-emitting device to which the optical device described in patent literature 1 is applied, the frame-shaped member 1032 having the step 1032b supports the glass member 1033. This configuration enlarges the distance between the light-emitting element and the lower surface of the glass member 1033 for the thickness of a portion of the frame-shaped member 1032 on which the glass member 1033 is placed. In such a configuration, spread of the light emitted from the light-emitting element becomes large and a portion of the light may be blocked by the frame-shaped member 1032 or the like.

In the package described in patent literature 2, because the window body is supported by the first frame body located at the upper tier of the frame body having the two-tier configuration, the distance between a bottom surface of the recess of the base body and the lower surface of the window body is large. In this case, when a light-emitting element is mounted in the recess of the base, the spread of the light emitted by the light-emitting element and irradiating the lower surface of the window body becomes large. Therefore, the light is likely to be blocked by the first or second frame body. Moreover, when a plurality of light-emitting elements are mounted, light passing through the window body from one light-emitting element and light passing through the window body from an adjacent light-emitting element have a small distance therebetween, which makes it difficult to combine one optical member (e.g., lens) with light from one light-emitting element.

Figure 1C:
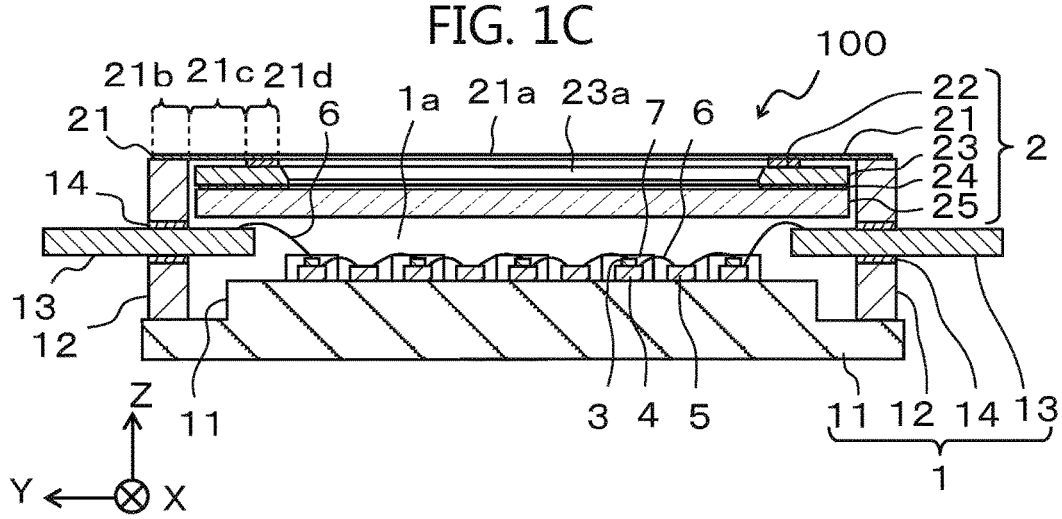
FIG. 1C is a cross-sectional view taken along line IC-IC in FIG. 1A, showing the configuration of the light-emitting device according to the embodiment.
Figure 1D:
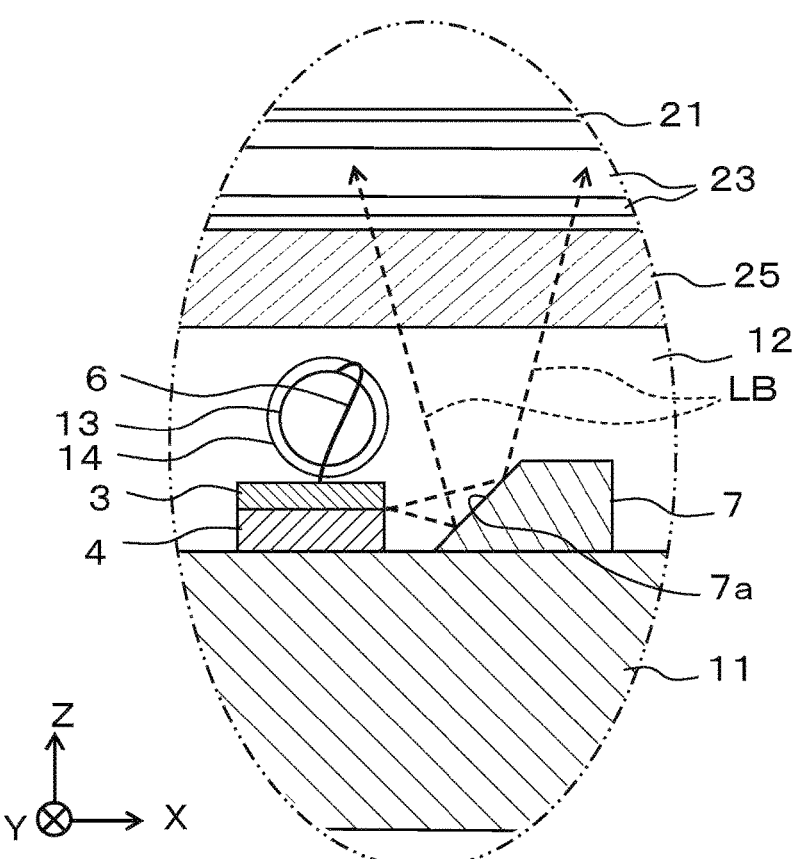
FIG. 1D is a cross-sectional view enlarging region ID enclosed by the two-dot chain line in FIG. 1B, showing the configuration of the light-emitting device according to the embodiment.

In the present embodiment, as shown in FIGS. 1B to 1D, because the light-transmitting member 25 is disposed at the lowermost layer of the cover member 2 and situated in the recess 1a, the distance between the lower surface of the light-transmitting member 25 and the light-emitting elements 3 is small. With this configuration, in comparison to the configurations described in patent literatures 1 and 2, a diameter of light emitted from any one of the light-emitting elements 3 on the upper surface of the light-transmitting member 25 can become smaller. Therefore, light from the light-emitting elements 3 is unlikely to be blocked by the ceramic member 23 or the like, and light from one light-emitting element 3 is easily combined with one optical member.

Incidentally, when it is allowable to accept the risk of breakage or disfigurement of the light-emitting device 100 in handling and accept a large distance between the light-transmitting member 25 and the light-emitting elements 3, the cover member 2 may be joined to the package 1 in an upside down manner such that the light-transmitting member 25 is situated outside the recess 1a.

The light-emitting elements 3 may each be a semiconductor laser element or a light-emitting diode (LED), such as one using a nitride semiconductor. Each of the light-emitting elements 3 is mounted via a submount 4, a pedestal on which the light-emitting element 3 is placed, on the raised portion 11a of base 11 of the package 1. In the present embodiment, edge-emitting type semiconductor laser elements are disposed as the light-emitting elements 3, in a two-dimensional matrix form of 5 elements in the Y-axis direction and 4 elements in the X-axis direction.

Each of the light-emitting elements 3 emits light in a direction parallel with the upper surface of the base 11, specifically, the positive direction along the X-axis in FIG. 1A for example. The light-emitting elements 3 each have positive and negative electrodes, one of which is disposed on a lower surface of the light-emitting element 3 and the other of which is disposed on an upper surface of the light-emitting element 3. The electrode disposed on the lower surface of each of the light-emitting elements 3 is joined to a corresponding submount 4 so as to be conducted with a conducting layer disposed on an upper surface of the corresponding submount 4. Each of the light-emitting elements 3 is connected with two wires 6, one of which is connected directly to the upper electrode of the light-emitting element 3 and the other of which is connected via the conducting layer disposed on the upper surface of the corresponding submount 4 to the lower electrode of the light-emitting element 3. Although the connection manner is not particularly limited, in the present embodiment, each set of five light-emitting elements 3 disposed in a line in the Y-axis direction is connected in series via a set of wires 6 and relay members 5, and is provided with one pair of the terminals 13.

Each of the submounts 4 has an external shape of a substantially rectangular parallelepiped shape, and has a base made of an insulating material and the conducting layer disposed on an upper surface of the base. Preferably, the insulating material constituting each base of the submounts 4 has good thermal conductivity so that heat generated by the corresponding light-emitting element 3 may be readily transferred to the base 11 of the package 1. Examples of such an insulating material include AlN and SiC.

The conducting layer may be made of a metal material having good electrical conductivity, examples of which include Cu, Au, Ag, and alloys of the foregoing.

The submounts 4 may be bonded to the base 11 of the package 1 using a metal bonding material or the like.

The light-emitting elements 3 may be mounted directly on the upper surface of the raised portion 11a of the base 11. However, mounting the light-emitting elements 3 via the submounts 4 like the present embodiment readily achieves insulation between the light-emitting elements 3 and the base 11 made of a metal material.

Each of the relay members 5 is located between corresponding adjacent two of the submounts 4 disposed in the Y-axis direction, and connects two of the wires 6 respectively electrically connecting with the light-emitting elements 3 on the two submounts. The relay members 5 may each have a base made of an insulating material and a conducting layer disposed on an upper surface of the base. In other words, the relay members 5 may have the same configuration as that of the submounts 4. Moreover, the relay members 5 are bonded to the base 11 of the package 1 in the same manner as the submounts 4.

Preferably, upper surfaces of the relay members 5 are at the same height as the upper surfaces of the submounts 4 or the light-emitting elements 3. Thus configured relay members 5 provides ease of connecting wires 6.

The wires 6 allows electrical connections between the light-emitting elements 3 and the terminals 13. The wires 6 may be made of Au, Ag, or Cu, for example.

The relay members 5 may be omitted, in which case each adjacent two of the light-emitting elements 3 may be directly connected with each other via one of the wires 6 and one of the submounts 4 of the adjacent two light-emitting elements 3. However, for the purpose of disposing adjacent light-emitting elements 3 at a greater distance from each other in each set of light-emitting elements 3 disposed in the Y-axis direction, it is preferable to dispose the relay members 5. With this configuration, each wire 6 may be made shorter, thus inhibiting an increase in the electric resistance of each wire 6. By disposing adjacent light-emitting elements 3 at a greater distance from each other in each set of light-emitting elements 3 disposed in the Y-axis direction, thermal interference of the light-emitting elements 3 may be reduced.

The light-emitting device 100 according to the present embodiment is highly useful from the viewpoint of reducing possibility of separation or breakage of the light-transmitting member 25 or the bonding material 24, when a plurality of, in particular six or more, light-emitting elements 3 are mounted. Moreover, when semiconductor laser elements each of which generates a large amount of heat are used as the light-emitting elements 3, the light-emitting device 100 according to the present embodiment is particularly useful. Moreover, when light-emitting diodes that emit ultraviolet light are used as the light-emitting elements 3, resin materials prone to degrade due to ultraviolet light cannot be used as a bonding material. Thus, the light-emitting device 100 using the bonding material 24 according to the present embodiment is particularly useful.

The light-reflecting members 7 are provided for the light-emitting elements 3, respectively. Each of the light-reflecting members 7 is a mirror that reflects light emitted in a direction parallel with the upper surface of the base 11 from a corresponding one of the light-emitting elements 3, which are edge-emitting type semiconductor laser elements, toward an upward direction where the light-transmitting member 25 serving as the light extraction surface of the light-emitting device 100 is situated. Specifically, as shown in FIG. 1D, each of the light-reflecting members 7 is disposed such that a light-reflecting surface 7a of the light-reflecting member 7 is inclined at an angle of 45 degrees with respect to the upper surface of the base 11 and such that the light-reflecting surface 7a faces the light emission surface, an edge surface located furthest in the positive direction along the X-axis, of the corresponding light-emitting element 3. The laser beam LB emitted from the light-emitting element 3 is reflected by the light-reflecting surface 7a toward the positive direction along the Z-axis, i.e., the upward direction, and extracted through the light-transmitting member 25 to the outside.

Examples of the material for the light-reflecting member 7 include glass, synthesized quartz, and sapphire, as well as metal materials such as Al. The light-reflecting surface 7a may be coated with a light-reflecting film such as a metal film made of Al or Ag, or a distributed Bragg reflector (DBR) composed of a dielectric multilayer film.

The dimensions of each of the light-reflecting members 7 and the distance from the corresponding light-emitting element 3 to the light-reflecting member 7 may be appropriately decided on the basis of the spread angle of the laser beam LB emitted from the light-emitting element 3. In addition, the inclination angle of the light-reflecting surface 7a may be appropriately decided on the basis of the emission direction of the laser beam LB from the light-emitting element 3. The light-reflecting members 7 may be omitted, in which case the light-emitting elements 3 are disposed so as to emit light in the upward direction. When each of the light-emitting elements 3 is a light-emitting diode that emits light from an upper surface and a side surface of the light-emitting diode, a light-reflecting member having a light-reflecting surface configured so as to surround the light-emitting element 3 may be used.

Various arrangements of the plurality of light-emitting elements 3 may be adopted. However, the plurality of light-emitting elements 3 are preferably disposed in a matrix form in a plan view, which facilitates providing uniform distribution in emission intensity when using the light-emitting device 100 as a light source of a projector.

The light-transmitting member 25 may be provided with an optical member, such as a lens array in which collimator lenses respectively corresponding to the light-emitting elements 3 are integrated, on an upper surface of the light-transmitting member 25. In such a case, because the hermetic sealing of the light-emitting device 100 is unlikely to be broken, the optical member may be bonded to the light-transmitting member 25 using an adhesive containing organic materials such as a UV-curable adhesive. That is, the light-emitting device 100 hermetically seals light-emitting elements 3 having high light density, and the hermetic sealing of the light-emitting device 100 is unlikely to be broken. For this reason, even when an adhesive containing organic materials is used for bonding the light-transmitting member 25 and the optical member to each other, dust originating from the organic materials may be prevented from depositing on light emission edge surfaces of the light-emitting elements 3 and peripheries thereof.

Variant Embodiments

Next, a description is given of variant embodiments of the cover member according to the above-described embodiment of the present disclosure.

The light-emitting device 100 shown in FIGS. 1A to 1C can be modified by arranging members such as the light-emitting elements 3 in the recess 1a of the package 1 and sealing the opening of the recess 1a with one of the cover members of the variant embodiments described below in place of the cover member 2.

First Variant Embodiment

Figure 3A:
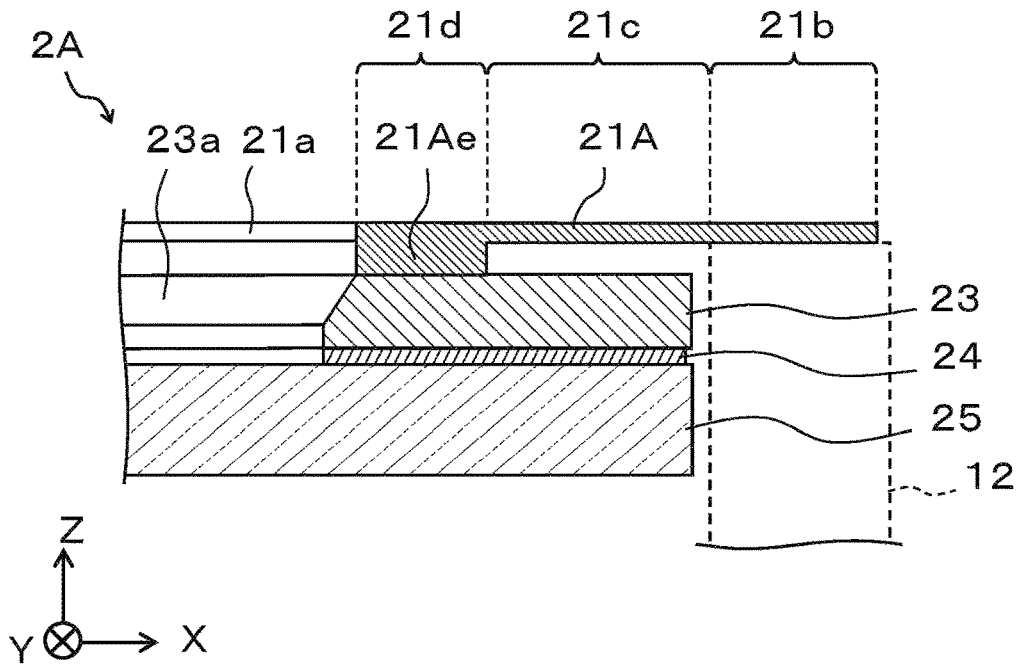
FIG. 3A is a cross-sectional view showing a configuration of a cover member according to a first variant embodiment.

A description is given of a cover member according to a first variant embodiment with reference to FIG. 3A.

The cover member 2A of the first variant embodiment corresponds to the cover member 2 shown in FIGS. 2A and 2B, except that the cover member 2A has a metal member 21A in place of the metal member 21 and the intermediate member 22 is eliminated. The metal member 21A is joined to the ceramic member 23 by brazing. As shown in FIG. 3A, on the lower surface of the metal member 21A, a loop-shaped raised portion 21Ae is formed along the opening 21a, i.e., along an inner contour of the metal member 21A. A lower surface of the raised portion 21Ae is joined to the ceramic member 23. In the other words, the metal member 21A has an external shape that corresponds to the metal member 21 and the intermediate member 22 bonded to each other in the cover member 2. The metal member 21A having such an external shape is bonded to the ceramic member 23 in a narrow area without using the intermediate member 22 having a narrow width, thereby defining the non-bonding region 21c having the same width as that of the cover member 2.

The metal member 21A may be produced for example by the following procedure. First, a metal sheet having a uniform thickness is processed into a plate having a loop-shape in a plan view, by press punching or cutting process using laser or the like. Next, a portion of the plate other than a portion thereof corresponding to the raised portion 21Ae is processed to have a thin thickness by cutting or the like. Next, surfaces of the plate are plated with a metal to increase weldability with the package 1.

The metal member 21A is joined to the ceramic member 23 by brazing. This joining may be achieved using an active brazing material.

The configurations other than the above are the same as those described for the cover member 2, and thus detailed description thereof is omitted.

Second Variant Embodiment

Figure 3B:
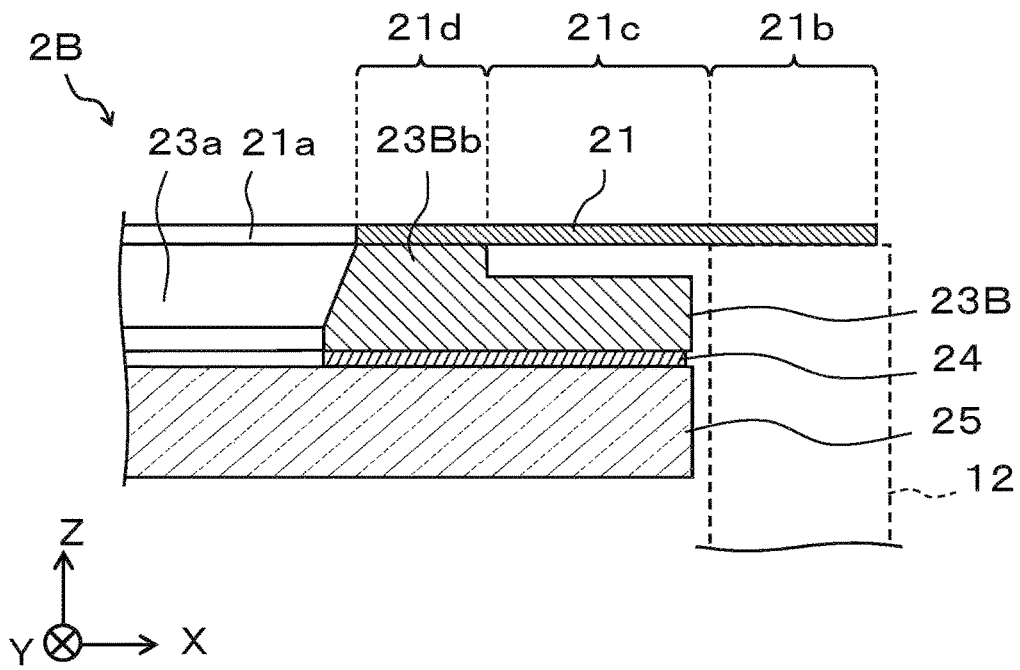
FIG. 3B is a cross-sectional view showing a configuration of a cover member according to a second variant embodiment.

Next, a description is given of a cover member according to a second variant embodiment with reference to FIG. 3B.

The cover member 2B of the second variant embodiment corresponds to the cover member 2 shown in FIGS. 2A and 2B, except that the cover member 2B has a ceramic member 23B in place of the ceramic member 23 and the intermediate member 22 is eliminated. The ceramic member 23B has an upper surface on which a loop-shaped raised portion 23Bb is formed along an inner contour of the ceramic member 23B. The raised portion 23Bb is formed to have the same shape as the intermediate member 22 in the cover member 2. In the other word, the ceramic member 23B in the second variant embodiment has an external shape that corresponds to the ceramic member 23 and the intermediate member 22 bonded to each other in the cover member 2. Although the lower surface of the metal member 21 is flat, joining the metal member 21 to an upper surface of the raised portion 23Bb of the ceramic member 23B in the region 21b of the metal member 21 allows the region 21c thereof left as a region to which no member is joined.

The metal member 21 is joined to the ceramic member 23B by brazing. Optionally, a metallized layer may be formed on the joining surface of the ceramic member 23B before the joining.

The ceramic member 23B may be formed for example by pressing a powder material using a mold to form an article having an external shape and then sintering the article, in the same manner as the forming process of the ceramic member 23 of the cover member 2. In this process, the mold is configured so as to form the external shape of the ceramic member 23B including the raised portion 23Bb.

Configurations other than the above are the same as those described for the cover member 2, and thus detailed description thereof is omitted.

Incidentally, the ceramic member 23B of the second variant embodiment has the raised portion 23Bb raised upward as a substitute for the intermediate member 22. That is, the ceramic member 23B can be said to have a step. In the second variant embodiment, the step is formed on an upper surface side of the ceramic member 23B, while the bonding material 24 is disposed on the lower surface of the ceramic member 23B. With this configuration, even if the step has a corner to which stress is likely to be concentrated, the corner is spaced apart from the bonding material 24 and thus breakage or the like is unlikely to occur in the bonding material 24. Therefore, the reliability of the light-emitting device 100 may be improved.

As described, the ceramic member 23B holding the light-transmitting member 25 may have an external shape with a step. In such a case, possibility of separation or breakage of the bonding material 24 is reduced by not satisfying both the following two conditions: (i) the step has one surface on which the bonding material 24 is disposed, and (ii) the step has another surface which meets the one surface and which is directly connected to the bonding surface of the ceramic member 23B bonded or joined to the metal member 21 (or the intermediate member 22).

Third Variant Embodiment

Figure 4:
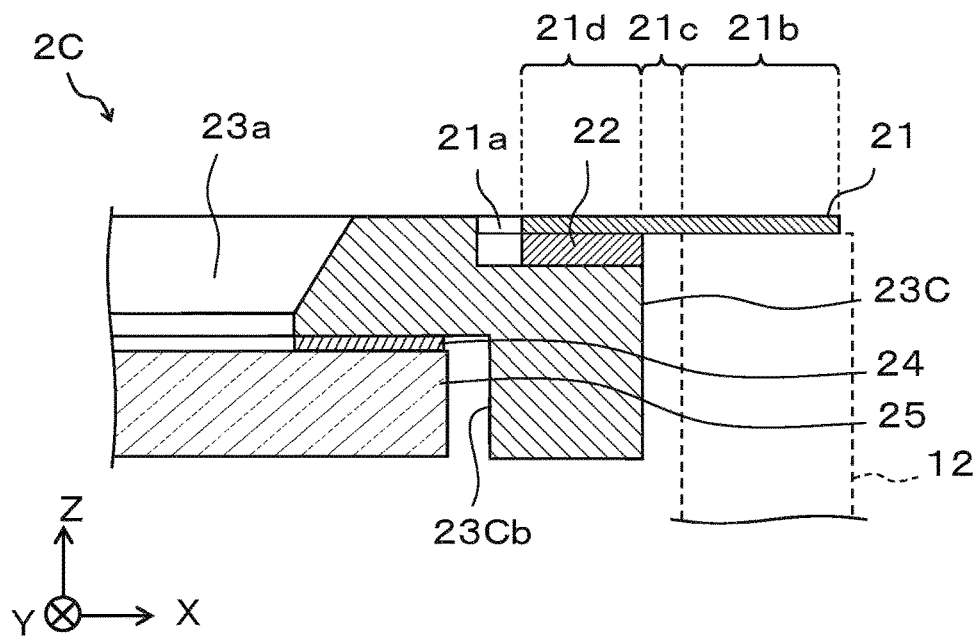
FIG. 4 is a cross-sectional view showing a configuration of a cover member according to a third variant embodiment.

Next, a description is given of a cover member according to a third variant embodiment with reference to FIG. 4.

The cover member 2C of the third variant embodiment corresponds to the cover member 2 shown in FIGS. 2A and 2B, except that the cover member 2C has a ceramic member 23C in place of the ceramic member 23. As shown in FIG. 4, the ceramic member 23C has along an outer contour a loop-shaped side wall 23Cb that projects downward.

The ceramic member 23C includes an upwardly facing step and a downwardly facing step. The upwardly facing step does not have a surface on which the bonding material 24 is disposed. In addition, surfaces of the downwardly facing step are not directly connected to the bonding surface of the ceramic member 23C where the ceramic member 23C and the intermediate member 22 are bonded to each other. That is, the ceramic member 23C does not include a step having such a positional relation as that of the step 1032b shown in FIG. 5, and thus can be said to have no corner to which stress is likely to be concentrated. Therefore, breakage or the like is unlikely to occur in the bonding material 24, and thus the reliability of the light-emitting device 100 may be improved.

The light-transmitting member 25 is bonded via the bonding material 24 to the ceramic member 23C on a flat lower surface thereof located on an inner periphery side of the ceramic member 23C. The bonding material 24 is disposed only in a region of the flat lower surface of the ceramic member 23C that faces the light-transmitting member 25, and is not disposed between a side surface of the light-transmitting member 25 and an inner side surface of the side wall 23Cb. That is, in the present variant embodiment, the bonding material 24 is disposed such as to have a flat plate shape and has no portion that is likely to have weak bonding strength. That means the bonding material 24 is unlikely to break or separate from the ceramic member 23C or the light-transmitting member 25 even when the light-emitting device 100 is in operation and thermal stress due to the heat generated by the light-emitting elements 3 is applied. As described above, the downwardly facing step of the ceramic member 23C can be said to have no corner to which stress is likely to be concentrated like the one shown in FIG. 5. Thus, the bonding material 24 may be disposed on a side surface of the downwardly facing step of the ceramic member 23C.

The ceramic member 23C may be formed for example by pressing a powder material using a mold to form an article having an external shape and then sintering the article, in the same manner as the forming process of the ceramic member 23 of the cover member 2. In this process, the mold is configured so as to form the external shape of the ceramic member 23C including the side wall 23Cb.

Configurations other than the above are the same as those described for the cover member 2, and thus detailed description thereof is omitted.

The third variant embodiment may be combined with the first or second variant embodiment. That is, in the cover member 2C of the third variant embodiment, the metal member 21 and the intermediate member 22 may be replaced with the metal member 21A of the first variant embodiment; or, in the cover member 2C of the third variant embodiment, the intermediate member 22 may be omitted and an uppermost surface of the ceramic member 23C may be joined to the metal member 21.

Certain embodiments of a light emitting devices have been described above, but the scope of the present invention is not limited to the above description. Rather, the invention is to be broadly interpreted based on the description of claims. In addition, various modifications and variations made based on the above description are also included in the scope of the present invention, as a matter of course.

The light emitting devices of the embodiments according to the present disclosure are applicable to light source devices of projectors as well as various kinds of lighting devices and automotive light emitting devices.

What is claimed is:

1. A light-emitting device comprising:
   a package made of a metal material and defining a recess, the package comprising a side wall defining a side of the recess, wherein an opening of the recess is located at an upper side of the package;
   a plurality of light-emitting elements disposed in the recess; and
   a cover member disposed so as to close the opening of the recess, the cover member comprising:
      a light-transmitting member having a primary surface,
      a ceramic member having a loop-shape and having a first surface and a second surface opposite the first surface, the first surface being bonded to the primary surface of the light-transmitting member via a bonding material, and
      a metal member having a loop-shape and comprising:
         a first portion bonded to the second surface of the ceramic member,
         a second portion located outward of the first portion in a plan view and joined to an upper surface of the side wall of the package, and
         a third portion located between the first portion and second portion in the plan view, at which the metal member is not bonded to any other member, such that an empty space is located between the third portion of the metal member and the second surface of the ceramic member,
      wherein the metal member and the ceramic member are bonded to each other via an intermediate member having a loop-shape interposed therebetween, the intermediate member being made of a metal material and having an outer edge that is located inward of an outer edge of the ceramic member in a plan view.

2. The light-emitting device of claim 1, wherein the primary surface of the light-transmitting member is an upper surface of the light-transmitting member, and the ceramic member and the light-transmitting member are located in the recess.

3. The light-emitting device of claim 1, wherein the plurality of light-emitting elements are (i) semiconductor laser elements, or (ii) light-emitting diodes configured to emit ultraviolet light.

4. The light-emitting device of claim 1, wherein the light-emitting device includes six or more of the light-emitting elements.

5. The light-emitting device of claim 1, further comprising a terminal electrically connected to at least one of the plurality of light-emitting elements, the terminal penetrating the side wall of the package and projecting outside the package.

6. The light-emitting device of claim 1, wherein the light-transmitting member is made of a glass material and the bonding material is a glass bonding material.

7. The light-emitting device of claim 6, wherein a softening point of the bonding material is lower than a softening point of the light-transmitting member.

8. The light-emitting device of claim 1, wherein:
   the metal member comprises a base material made of an Fe—Ni—Co alloy or an Fe—Ni alloy, and at least a surface of the second portion of the metal member is plated with a metal;
   the intermediate member is made of copper;
   the ceramic member is made of alumina;
   the metal member and the upper surface of the side wall of the package are welded to each other via the second portion of the metal member; and
   the ceramic member and the intermediate member are brazed together via an active brazing material.

9. A light-emitting device comprising:
   a package made of a metal material and defining a recess, the package comprising a side wall defining a side of the recess, wherein an opening of the recess is located at an upper side of the package;
   six or more semiconductor laser elements disposed in the recess; and
   a cover member disposed so as to close the opening of the recess, the cover member comprising:
      a light-transmitting member having a primary surface;
      a ceramic member having a loop-shape and having a first surface and a second surface opposite the first surface, the first surface being bonded to the primary surface of the light-transmitting member with a bonding material; and
      a metal member with a loop-shape and comprising:
         a first portion bonded to the second surface of the ceramic member,
         a second portion located outward of the first portion in a plan view, and joined to an upper surface of the side wall of the package, and
         a third portion located between the first portion and second portion in the plan view, at which the metal member is not bonded to any other member, such that an empty space is formed between the third portion of the metal member and the second surface of the ceramic member
      wherein the metal member and the ceramic member are bonded to each other via an intermediate member having a loop-shape interposed therebetween, the intermediate member being made of a metal material and having an outer edge that is located inward of the outer edge of the ceramic member in a plan view.

10. The light-emitting device of claim 9, wherein the primary surface of the light-transmitting member is an upper surface of the light-transmitting member, and the ceramic member and the light-transmitting member are located in the recess.

11. The light-emitting device of claim 9, further comprising a terminal electrically connected to at least one of the plurality of light-emitting elements, the terminal penetrating the side wall of the package and projecting outside the package.

12. The light-emitting device of claim 9, wherein:
the metal member comprises a base material made of an Fe—Ni—Co alloy or an Fe—Ni alloy, and at least a surface of the second portion of the metal member is plated with a metal;
the intermediate member is made of copper;
the ceramic member is made of alumina;
the metal member and the upper surface of the side wall of the package are welded to each other via the second portion of the metal member; and
the ceramic member and the intermediate member are brazed together via an active brazing material.

* * * * *